United States Patent [19]

Kertis

[11] Patent Number: 5,058,067
[45] Date of Patent: Oct. 15, 1991

[54] INDIVIDUAL BIT LINE RECOVERY CIRCUITS

[75] Inventor: Robert A. Kertis, Puyallup, Wash.

[73] Assignee: National Semiconductor Corporation, Santa Clara, Calif.

[21] Appl. No.: 533,978

[22] Filed: Jun. 6, 1990

[51] Int. Cl.⁵ .............................................. G11C 13/00
[52] U.S. Cl. ............................... 365/190; 365/189.06; 365/189.11; 365/203
[58] Field of Search .............. 365/190, 189.06, 189.11, 365/203, 225

[56] References Cited

U.S. PATENT DOCUMENTS 4,984,204  1/1991  Sato et al. ..................... 365/189.11

Primary Examiner—Terrell W. Fears
Attorney, Agent, or Firm—Townsend and Townsend

[57] ABSTRACT

A bipolar recovery circuit for a static random access memory cell is described. The circuit corrects reverse emitter-base breakdown which occurs in the known common base node writing recovery circuits. The circuit is simple, requiring little silicon chip area to fabricate. In a preferred embodiment, a separate recovery circuit is coupled to each of the true output line and the complement output line of the memory cell.

6 Claims, 3 Drawing Sheets ic memories. More particularly, it relates to an integrated circuit Static Random Access Memory ("SRAM") with improved recovery after writing characteristics to enable faster reading of the memory.

INDIVIDUAL BIT LINE RECOVERY CIRCUITS

BACKGROUND OF THE INVENTION

1. Field of the Invention

This invention is in the field of integrated circuit memories. More particularly, it relates to an integrated circuit Static Random Access Memory ("SRAM") with improved recovery after writing characteristics to enable faster reading of the memory.

2. Description of the Relevant Art

Many types of SRAMs are now well known. Typically, an SRAM memory is fabricated on a semiconductor substrate as an array of memory cells. At present, integrated circuit technology allows fabricating about one million SRAM cells on a single chip.

FIG. 1 depicts a typical prior art static SRAM cell implemented using NMOS fabrication technology. The cell shown consists of a flip-flop of cross-coupled transistors 13 and 14 and access transistors 11 and 12. The access transistors are turned on when the word line is selected (raised in voltage) and they connect the flip-flop to the true Bit output line and the complement $\overline{\text{Bit}}$ output line, labelled herein as Bit and $\overline{\text{Bit}}$, respectively. The access transistors act as transmission gates, allowing bidirectional current flow between the flip-flop and the Bit and $\overline{\text{Bit}}$ lines. To emphasize this point, the drains and sources of the access transistors are not distinguished. Transistors 15 and 16 act as a load for the memory cell, limiting the current flow through the cell.

To read or write a memory cell, the voltage of its word line is raised, thus turning on access transistors 11 and 12. In this way, one side of the cell flip-flop is connected to the Bit line and the other side is connected to the $\overline{\text{Bit}}$ line. Consider as an example the read operation for the cell in FIG. 1 and assume that the cell is storing a 0. In this case transistor 13 is on and transistor 14 is off. When transistors 11 and 12 are turned on, current flows from the Bit line through transistors 11 and 13 to ground. This causes the voltage of the Bit line to be pulled down slightly. Simultaneously, the $\overline{\text{Bit}}$ line is held high by a bit-line load structure (not shown). The resulting voltage difference between the Bit and $\overline{\text{Bit}}$ lines represents the state of the memory cell and is detected by a column sense amplifier (not shown). The magnitude of the voltage differential during reading operations is roughly 100 millivolts.

A write operation in the illustrated SRAM cell occurs in the following way. The information to be written and its complement are transferred to the Bit and $\overline{\text{Bit}}$ lines. Thus, if a 1 is to be written, the Bit line is held at $V_{cc}$ and the line is lowered to ground ($V_{ss}$). The magnitude of the voltage differential between Bit and $\overline{\text{Bit}}$ during writing operations is typically several volts. The appropriate word line is then turned on. The conducting transistors 11 and 12 then cause the high voltage on the Bit line to appear at the gate of transistor 14 and the drain of transistor 13 and the low voltage on the $\overline{\text{Bit}}$ line to appear at the gate of transistor 13 and the drain of transistor 14. This state, which denotes a stored 1, will be maintained indefinitely unless changed by another write operation.

During reading operations, the finite currents available in transistors 11 and 12, the resistance of the bit lines load structure, and the capacitances of the Bit and $\overline{\text{Bit}}$ lines determine the fall and rise times of the signals on the Bit and $\overline{\text{Bit}}$ lines. These times, in turn, contribute to the access time of the SRAM. Typical signal timing characteristics are shown in FIG. 2.

To improve SRAM performance, attempts have been made to reduce these components of time delay. During reading operations, the reading time is determined by the time required for the voltages on the Bit and $\overline{\text{Bit}}$ to cross over or "exchange" their values. One method which reduces this time is changing the voltages of the Bit and $\overline{\text{Bit}}$ lines from the values acquired in the previous cycle to a value midway between those values while the signal on the word line is changing. Thus, as transistors 11 and 12 turn on, the Bit and $\overline{\text{Bit}}$ lines will have to charge and discharge less than if the Bit and $\overline{\text{Bit}}$ lines were to start from their extreme original values. In this way, the time taken for the memory cell to create a new voltage differential between Bit and $\overline{\text{Bit}}$ will be reduced. The lower set of waveforms in FIG. 2 illustrates the technique. The process is known as equilibration and precharge. It is controlled by a pulse automatically generated whenever a change in the row or word address inputs is detected. One problem with this method is that an extra circuit is required to detect the beginning of the reading operation and to short the Bit and $\overline{\text{Bit}}$ lines together. Such an extra circuit increases the complexity of the SRAM and uses valuable surface area on the integrated circuit.

Another technique for speeding circuit operation without equilibration and precharge is to decrease the resistance of the bit line load structure. Because the RC time constant created by bit line capacitances and the load structure resistance largely determines the rise and fall time of the voltages on the bit lines, decreasing the resistance of the load directly improves the speed of the memory. However, such a reduction in resistance also decreases the voltage differential between the bit lines, which can result in too small a voltage differential to allow for the cell to be read reliably.

The time required to re-establish the correct reading differential on the bit lines after a writing operation is an important factor in the speed of the SRAM. During writing, a voltage differential of several volts is established on the bit lines. To read the cell, this differential must be "recovered" to the approximately 100 millivolt maximum differential required for reading.

Write-recovery circuits which hasten removal of the voltage transients following a write operation are known. A write-recovery circuit "recovers" or forces the bit lines in the column to which data last was written to be within a predetermined voltage differential to permit reading. During a write operation, a write recovery circuit holds all bit lines at a high potential, other than the one bit line pulled low during the write. After the write operation, the recovery circuit pulls the low bit line up to the high potential.

A typical prior art write-recovery circuit is shown in FIG. 3. During a read operation, the circuit shown in FIG. 3 places all bit lines at the common high potential. The circuit detects when a write transition occurs, then generates an address transition pulse (ATP) which pulls the low bit line back up to the high potential. In the circuit shown in FIG. 3, transistors M1 and M2 short the bit lines to the high potential, Vcc, during a read operation. An ATP generator G1 activates transistors M3, M4 and M5 when an address transition occurs. Although only one ATP generator is shown in FIG. 3, it is possible to have more than one such generator in a given SRAM memory. Transistors M3 and M5 pull-up or "recover" the appropriate bit line Bit or $\overline{\text{Bit}}$, and at the same time transistor M4 acts as a shunt to equalize the voltage between Bit and $\overline{\text{Bit}}$. Because one of the bit lines is already at the high potential, transistor M4 causes both bit lines to be within a small voltage differential of one another, enabling a read operation to be performed.

Prior art circuits of the type shown in FIG. 3 have several disadvantages. Transistors M3 and M5 typically are relatively slow MOS devices resulting in relatively long recovery times. Furthermore, the width of the ATP pulse is critical: too narrow a pulse causes poor recovery and extended access time; too wide a pulse wastes time, slowing the entire memory system. In general, prior art circuits of the type shown in FIG. 3 are only capable of recovering in approximately 3 nanoseconds, and produce approximately 30 nanosecond system access time.

Other prior art circuits have been used to speed the bit line recovery to the differential voltage levels needed to read the memory cell. One such circuit is shown in FIG. 4. Each bit line Bit and $\overline{\text{Bit}}$ is selectively connected to a high potential $V_{cc}$ through series connected PMOS load transistors 41 and 42. At the beginning of a write cycle, the PMOS load transistors are on, placing all bit lines at the high potential. During a write operation the PMOS load transistors connected to the bit line Bit and the complement bit line $\overline{\text{Bit}}$ of the column containing the cell to be written are turned off, enabling the selected one of the Bit or $\overline{\text{Bit}}$ line to be pulled low, during which time data is written to the cell. For purposes of the remaining explanation we assume the Bit line was the selected line and the $\overline{\text{Bit}}$ line was not selected. After data is written to the cell, the nonselected bit line $\overline{\text{Bit}}$ is pulled down to an intermediate voltage by a bipolar clamp transistor (not shown) and a bipolar pull-up transistor 43 pulls the selected bit line Bit up to the intermediate voltage. As the selected line is pulled up, a shunt transistor 45 shunts it to the nonselected line to minimize the voltage differential between the two bit lines and hasten recovery. Simultaneously, PMOS load transistors 41 and 42, which are in series with both bit lines, are turned back on, returning the bit lines to the high potential. A sense amplifier circuit (not shown) connected to the column then may be used to read the cell contents. In one implementation of this method with a 32 column array, 64 pairs of bipolar junction pull-up transistors all have a common base node W2b. One problem with using this common base node bipolar junction transistor circuit is that, as one or the other bit line is pulled low in order to write to the selected memory cell, the bipolar junction transistor coupled to the other bit line, which bit line remains high, can experience reverse emitter-base breakdown when W2b is pulled low. To prevent this, the common base node must be clamped to a particular voltage. In one known implementation this problem was eliminated by creating the bipolar transistors with a material having a high reverse breakdown voltage. Using this material, however, also resulted in a slower transistor, reducing the benefit of the recovery circuit.

Thus, a need exists for a circuit which can reduce the time necessary for an SRAM memory cell to recover from writing, yet which does not suffer the common base node problems of the prior art circuits.

SUMMARY OF THE INVENTION

The present invention provides a bit line recovery circuit suitable for connection to the bit lines in a column of SRAM memory cells. The recovery technique employed decreases the time required to recover the SRAM memory cells in the column to the proper voltage differential for reading the cell after writing operations.

A bit line recovery circuit includes a bipolar junction transistor ("BJT") coupled to two MOS switching transistors. The recovery circuit is coupled to the bit lines of a column of memory cells, with a separate recovery circuit being coupled to each true and complement bit line. During writing operations these bit line recovery circuits are deactivated. During recovery from writing, the Bit or $\overline{\text{Bit}}$ lines are pulled up to their proper values more quickly by means of this network.

In a preferred embodiment the recovery circuit includes a bipolar transistor having an emitter connected to the bit line, a collector to a high potential source, and a base connected to a node. The recovery circuit also includes serially connected PMOS and NMOS transistors connected between the high potential and the bit line. The gates of the PMOS and NMOS transistors are connected together to receive a write signal, while the connection between the source and drain of the PMOS and NMOS transistors provides the node to which the bipolar base is connected.

In addition to the recovery circuits coupled to the bit lines, a voltage clamping circuit is also coupled to the bit lines. During writing operations to the selected cell, the clamping circuit clamps one of the bit lines to a high voltage level, as well as one of either the Group True Output Read or Group Complement Output Read lines, which are the output lines for a group of columns in this embodiment. After writing, the same voltage clamping circuit recovers the low level bit line to near the correct reading voltage as well as the lower of the Group True Output or Group Complement Output lines. Additional switching means controls which lines the voltage clamping circuit is actually coupled to.

The present invention will be described more fully in conjunction with the following figures.

DETAILED DESCRIPTION OF THE PREFERRED EMBODIMENTS

Figure 5:
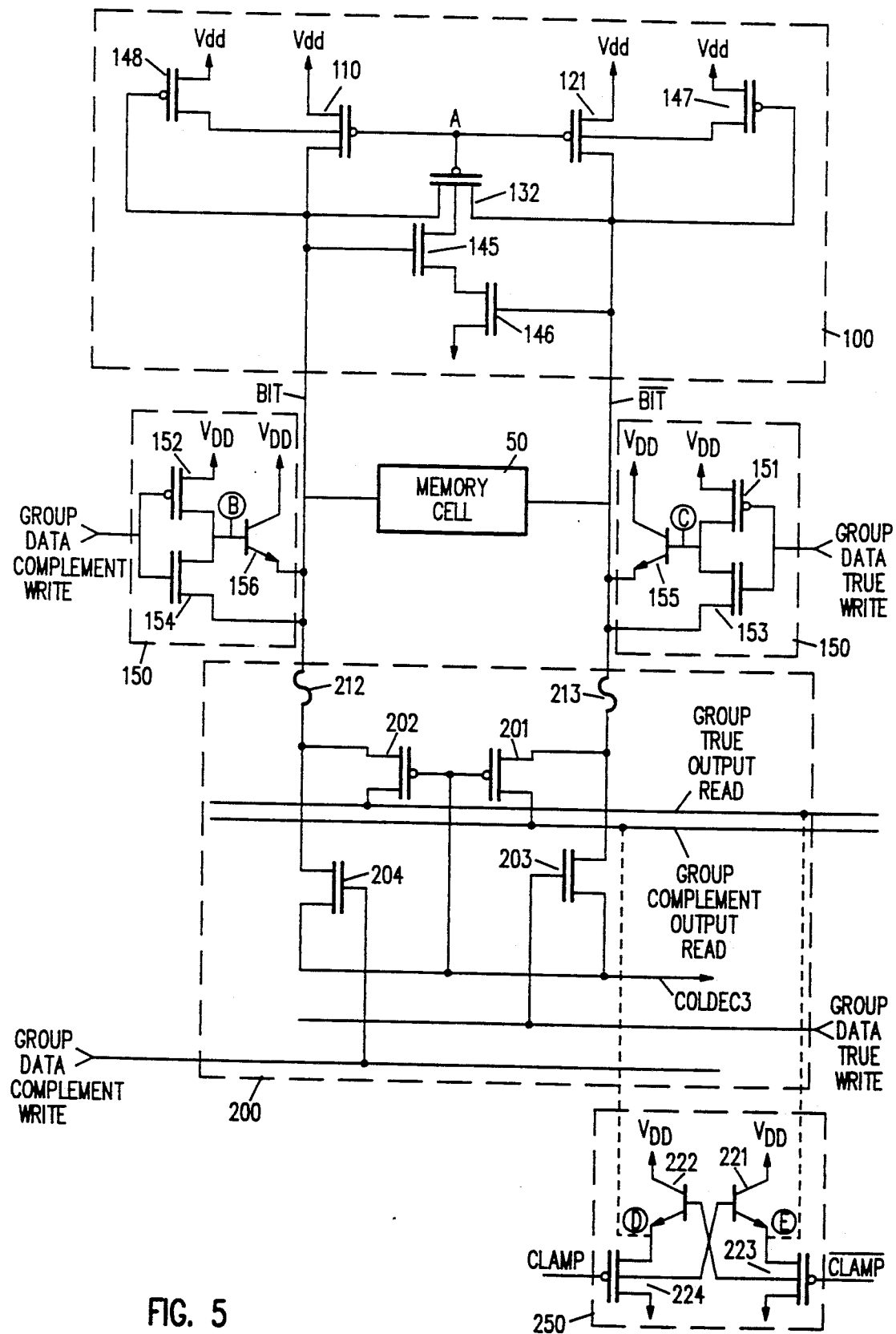
FIG. 5 is a schematic drawing of a preferred embodiment of the present invention.

FIG. 5 is a schematic drawing illustrating a preferred embodiment of the circuitry for a single column of static random access memory cells. The circuitry shown includes a pair of bit lines, Bit and $\overline{\text{Bit}}$, each pair of bit lines having a plurality of memory cells 50 coupled to them. Only one memory cell 50 is shown in FIG. 5.

Bit-line column load structure 100 provides a load structure for the column of memory cells, the load structure generates a differential voltage to a sense amplifier (not shown) which is coupled to the column of cells and which actually detects and amplifies the cell's contents. The load structure is described in a commonly assigned co-filed application entitled "Self-Locking Bit Line Load Structure," assigned Ser. No. 533,987. The construction and operation of that circuit are described in the co-filed application, which is incorporated herein in its entirety. Although not shown in FIG. 5, each memory cell is coupled to an appropriate row select line. The row select line and COLDECB are used together to select a particular memory cell 50 in the array for either reading or writing.

Bit line recovery circuits 150 are coupled to the bit lines, one recovery circuit being coupled to the Bit line and the other to the $\overline{\text{Bit}}$ line. Their operation is described subsequently.

Fuses 212 and 213, which are coupled to the bit lines in embodiments of the SRAM having spare columns of memory cells, may be blown to disconnect a defective column of memory cells from the column's input/output lines.

Circuit 250 is a clamping network for both the higher of the group true or complement output read signal and the higher of the two bit lines during writing. After writing operations are complete, the circuit recovers the lower of the two output read signals to the correct reading level, as well as assisting the recovery of the lower of the two bit lines.

Control circuit 200 controls the reading and writing of specific columns of memory cells. As indicated, each row of memory cells in the SRAM is coupled to a row select line. Additionally, each column of memory cells is coupled to a COLDECB signal line (active low), a Group Data True Write line, and a Group Data Complement Write. Each column of memory cells is also coupled to a Group True Output Read line and a Group Complement Output Read line. Together, these two output lines comprise the group output bus. In a preferred embodiment, 8 columns of memory cells are coupled to the output bus through eight read pass gates. In FIG. 5, the read pass gates for the illustrated column of memory cells are transistors 201 and 202. Specific memory cells are written to or read by simultaneous activation of COLDECB and the row select line. In the preferred embodiment, each COLDECB line can be coupled to up to four columns. Each column is coupled to a sense amplifier (not shown). If more than one column were to be read simultaneously, each column being read would require a separate sense amplifier. When parallel reading is performed, the read pass gates supply the differential voltage output from each selected memory cell to an individually assigned sense amplifier.

Figure 1:
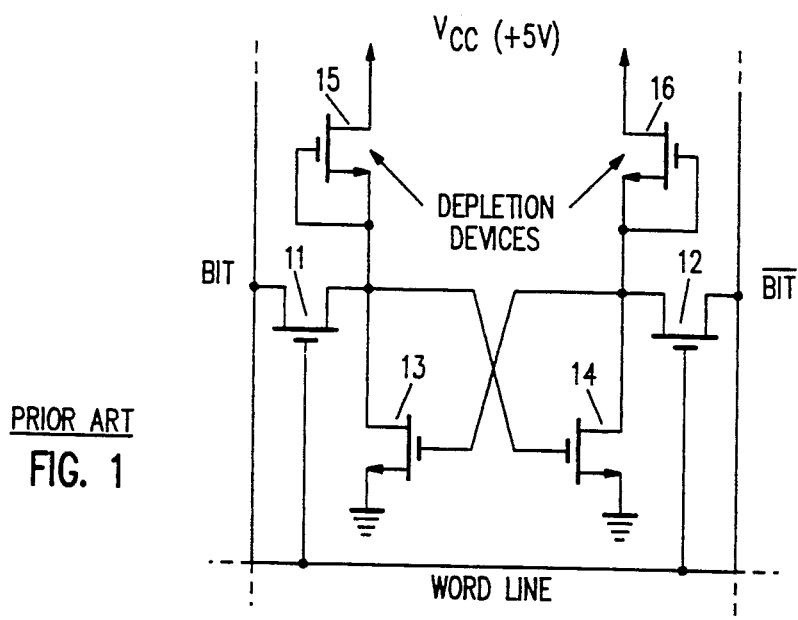
FIG. 1 illustrates a typical prior art SRAM memory cell.
Figure 2:
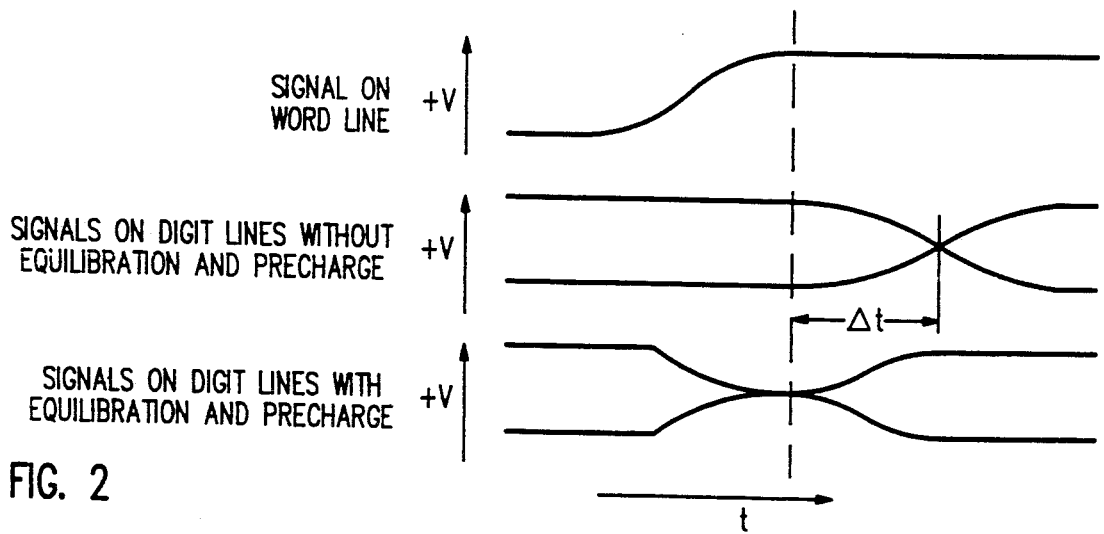
FIG. 2 shows the voltage versus time graphs for signals on the Bit and $\overline{\text{Bit}}$ lines in a known SRAM.

When the memory cell to which the bit line recovery circuits 150 are coupled is being read, both the Group Data True Write and Group Data Complement Write lines are at a low voltage level, herein 0 volts. This turns transistors 151 and 152 on and transistors 153 and 154 off. Nodes B and C are thus held at $V_{dd}$. Transistors 201 and 202 turn on (COLDECB goes active low during reading) and memory cell 50 is coupled to the output bus. As a result, assuming that cell 50 is of the type shown in FIG. 1, the lower level bit line is at $V_{dd}$-200 millivolts and the higher level bit line is at $V_{dd}$-100 millivolts. These voltage levels are less than the $V_{be}$ for BJTs 155 and 156.

Columns are written to whenever one of the Group Data True Write and Group Data Complement Write signals goes high. The logical AND formed from the COLDECB signal, the particular Group True or Complement Write signal, and the Row Select signal, determines in which column and to which particular cell the write will occur. During writing, the bit-line signal is discharged through either transistor 203 or 204. A total of eight NMOS writing transistors are coupled to the Group Data True Write and Group Data Complement Write lines in this embodiment. The Group Output signals are separated from the Group Write signals to allow a faster read operation by removing the parasitic capacitance of the Group Write lines from the Group Output Read lines.

During writing, either the Group Data True Write or Group Data Complement Write signal goes active (herein, high and +5 V). For the following example, it will be assumed that Group Data True Write is active. This turns on transistor 153 to short the base of bipolar junction transistor 155 (node C) to the emitter. This deactivates transistor 155 so that the $\overline{\text{Bit}}$ line can be pulled low. The COLDECB bus provides the selected column with the necessary low voltage level. While $\overline{\text{Bit}}$ is being discharged, there will be a small amount of through current on BJT transistors 155. This results from the fact that the $V_{be}$ for the BJT transistors is smaller than the $V_{tn}$ of NMOS transistor 153, primarily due to body effects. In the present invention, the $V_{tn}$ (voltage threshold) for transistors 153 and 154 is approximately 0.8 volts (without body effects) and the $V_{be}$ (Voltage base-emitter) for transistors 155 and 156 is approximately 0.7 volts. Additionally, the base charge on BJT 156 must dissipate before NMOS transistor 154 can turn on. Simultaneously with transistor 155 being deactivated, a high voltage level is provided to the memory cell, in particular the Bit line, by voltage regulating circuit 250. The $\overline{\text{Bit}}$ line discharges to the voltage level on the COLDECB line through transistor 203 which turned on when the Group Data True Write went high. The Bit line is clamped in this example to the voltage at node E ($V_{DD}$-$V_{be}$). Again, assuming Group Data True Write is high, node C is shorted to the $\overline{\text{Bit}}$ line, which prevents any reverse $V_{be}$ problems when $\overline{\text{Bit}}$ is pulled low.

Figure 6:
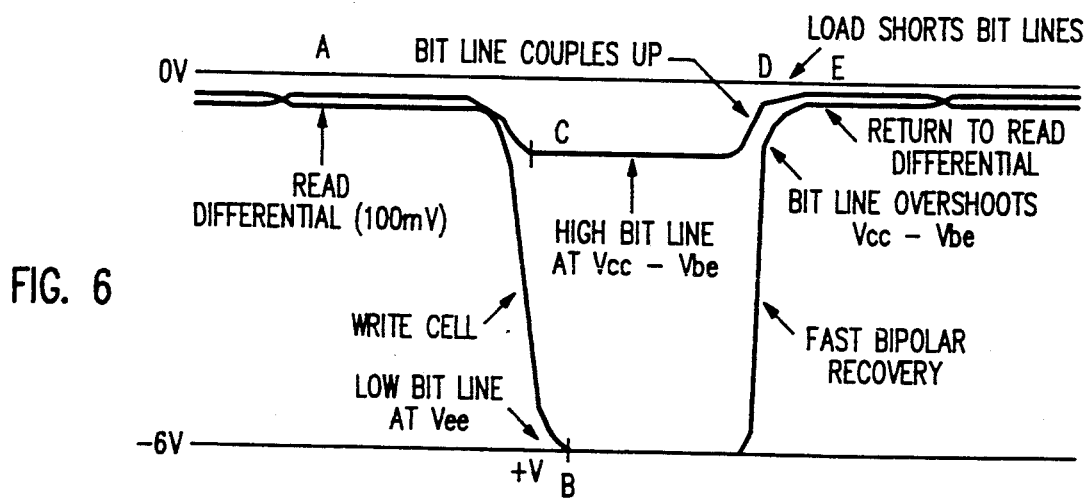
FIG. 6 shows the voltage versus time performance of the present invention.
Figure 3:
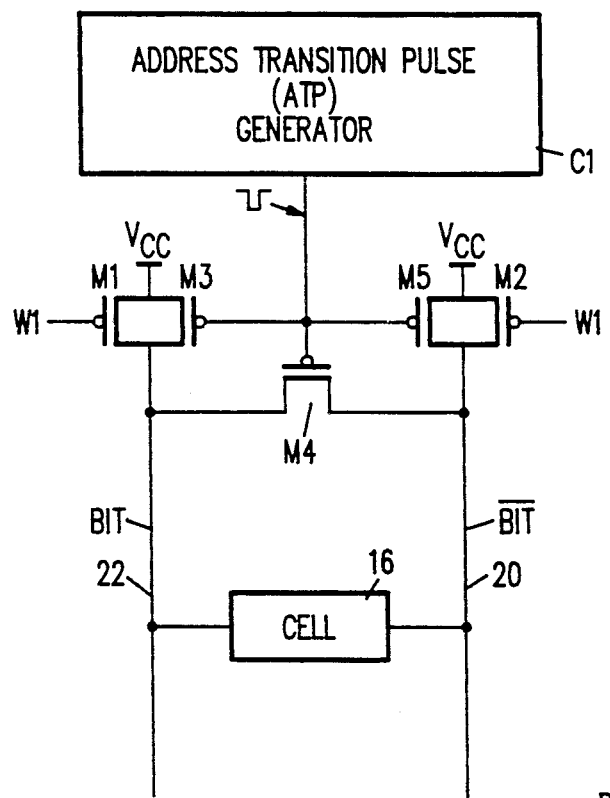
FIG. 3 is a schematic drawing of a known bit line recovery circuit.
Figure 4:
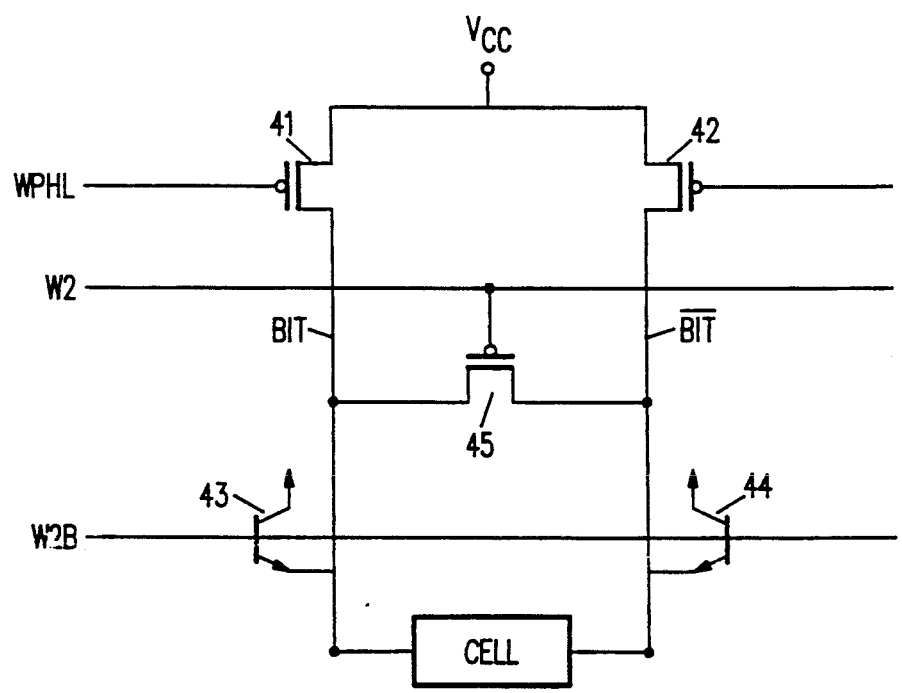
FIG. 4 is a schematic drawing of another known bit line recovery circuit.

FIG. 6 shows the Bit and $\overline{\text{Bit}}$ waveforms during writing and recovery from writing for the SRAM memory shown in FIG. 5. As shown in FIG. 6, the voltage differential between the bit lines maintained during reading operations is roughly 100 millivolt (Point A). As the writing operation described herein begins, the $\overline{\text{Bit}}$ line is discharged to a low voltage level (Point B). The Bit line is clamped by circuit 250 (FIG. 5) to $V_{dd}$-$V_{be}$ (Point C, FIG. 6).

After writing, during recovery, $\overline{\text{Clamp}}$ goes high (FIG. 5). Bit line load circuit 100 (FIG. 5), which turned off when $\overline{\text{Bit}}$ went low, turns on as $\overline{\text{Bit}}$ returns high and transistor 223 turns off. The Group Data True Write goes inactive low, turning off transistor 203. Transistor 151 turns on, providing current to BJT transistor 155. The charge stored in the base of transistor 155 allows the recovered bit-line high level to go above $V_{DD}$-$V_{be}$ (Point D, FIG. 6). Capacitive coupling also causes the high bit-line to be coupled above $V_{DD}$-$V_{be}$. At this point, as bit-line load structure 100 turns back on, the bit lines are shorted together and placed once again in a read state (Point E, FIG. 6). The operation of the present invention would be substantially the mirror image of the described operation if Group Data Complement Write were to go high.

Although a specific embodiment of this invention has been shown and described, it will be understood that various modifications may be made without departing from the spirit of this invention. For example, the voltage levels defining the high and low Bit and $\overline{\text{Bit}}$ lines could be inverted. This could be corrected by inverting the transistor types used in the circuit. Other such variations are readily envisioned. Therefore, the claims should be read in an expansive rather than restrictive sense.

I claim:

1. In a memory system comprised of a plurality of memory cells, the memory cells being arranged in a plurality of columns, each column having a true output line and a complement output line, each memory cell in the column being coupled to the true output line and the complement output line, the memory cells having information written to and read from them, a writing recovery circuit comprising:

write recovery circuit means, each column of memory cells having a first write recovery circuit means coupled to the true output line and a second write recovery circuit means coupled to the complement output line;

switching means coupled to both the true column output line and the complement output line, for turning the first and second write recovery circuit means off and on in response to the information being written to the memory cell.

2. The writing recovery circuit of claim 1 wherein the first and second write recovery means both further comprise:

bipolar junction transistor means having base, emitter, and collector, the emitter of the bipolar transistor means in the first write recovery circuit means being coupled to the true output line, the emitter of the bipolar junction transistor means in the second write recovery circuit means being coupled to the complement output line, the collectors of both bipolar junction transistor means being coupled to a voltage supply, the base of the bipolar junction transistor means in the first write recovery circuit means being coupled to a first node, and the base of the bipolar junction transistor means in the second write recovery circuit means being coupled to a second node;

NMOS transistor means having a gate, source, and drain, the drain of the NMOS transistor means in the first write recovery circuit means being coupled to the true output line, the drain of the NMOS transistor means in the second write recovery circuit means being coupled to the complement output line, the source of the NMOS transistor means in the first write recovery circuit means being coupled to the first node, the source of the NMOS transistor means in the second write recovery circuit means being coupled to the second node, the gate of the NMOS transistor means in the first write recovery circuit means being coupled to a complement write signal line, and the gate of the NMOS transistor means in the second write recovery circuit means being coupled to a true write signal line; and PMOS transistor means having gate, source and drain, the source of the PMOS transistor means in the first and second write recovery circuit means being coupled to the voltage source, the gate of the PMOS transistor means in the first write recovery circuit means being coupled to the complement write signal line, the gate of the PMOS transistor in the second write recovery circuit means being coupled to the true write signal line, the drain of the PMOS transistor circuit means in the first write recovery circuit means being coupled to the first node, and the drain of the PMOS transistor means in the second write recovery circuit means being coupled to the second node.

3. In a memory system which includes at least a first cell, first and second bit lines connected to the cell, writing means for writing information into the cell by decreasing the potential on a selected one of the bit lines, and reading means for reading information from the cell, operable when the bit lines are within a predefined differential of each other, write recovery circuits comprising:

voltage generator means, for generating a predefined clamping voltage;

first switching means coupled to the first bit line and the voltage generator means; and second switching means coupled to the second bit line and the voltage generator, the first and second switching means switching the predefined clamping voltage to the non-selected one of the bit lines when information is being written to the cell and switching the predefined clamping voltage to the selected one of the bit lines after information has been written to the cell to recover the bit lines to the predefined differential.

4. The write recovery circuit of claim 3 wherein the voltage generator means comprises:

a first bipolar junction transistor having base, collector and emitter, the collector being coupled to a voltage supply;

a second bipolar junction transistor means having emitter, base, and collector, the collector being coupled to a voltage supply;

a first PMOS transistor having a gate, source and drain, the source being coupled to the emitter of the first bipolar junction transistor, the drain being coupled to a ground voltage supply, and the gate of the first PMOS transistor and the base of the second bipolar transistor being coupled to a true clamp signal line; and a second PMOS transistor having gate, source and drain, the source being coupled to the emitter of the second bipolar junction transistor, the gate of the second PMOS transistor and the base of the first bipolar junction transistor being coupled to a complement clamp signal line and the drain being coupled to a ground voltage supply.

5. The write recovery circuit of claim 4 wherein the first switching means comprises:

Bipolar junction transistor having a base, emitter and collector, the collector being coupled to the voltage supply, the base being coupled to a first node, and the emitter being coupled to the first bit line;

PMOS transistor having a source, gate and drain, the source being coupled to the voltage supply, the gate being coupled to a complement write signal line, and the drain being coupled to the first node; and a NMOS transistor having a source, gate and drain, the source being coupled to the first node, the gate being coupled to the complement write signal line, and the drain being coupled to the first bit line.

6. The write recovery circuit of claim 5 wherein the second switching means comprises:

Bipolar transistor having a base, emitter and collector, the collector being coupled to the voltage supply, the base being coupled to a second node, and the emitter being coupled to the second bit line;

PMOS transistor having a source, gate, and drain, the source being coupled to the voltage supply, the gate being coupled to a true write signal line, and the drain being coupled to the second node; and NMOS transistor having a source, gate and drain, the source being coupled to the second node, the gate being coupled to the true write signal line, and the drain being coupled to the second bit line.

* * * * *